United States Patent
Wu et al.

(10) Patent No.: US 9,275,906 B2
(45) Date of Patent: Mar. 1, 2016

(54) METHOD FOR INCREASING A SURFACE AREA OF EPITAXIAL STRUCTURES IN A MIXED N/P TYPE FIN SEMICONDUCTOR STRUCTURE BY FORMING MULTIPLE EPITAXIAL HEADS

(71) Applicant: GLOBALFOUNDRIES Inc., Grand Cayman (KY)

(72) Inventors: Xusheng Wu, Ballston Lake, NY (US); Xiang Hu, Clifton Park, NY (US); Changyong Xiao, Mechanicville, NY (US); Wanxun He, Mechanicville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/267,611

(22) Filed: May 1, 2014

(65) Prior Publication Data

US 2015/0318217 A1    Nov. 5, 2015

(51) Int. Cl.

| H01L 21/8238 | (2006.01) |
|---|---|
| H01L 21/306 | (2006.01) |
| H01L 21/02 | (2006.01) |
| H01L 27/092 | (2006.01) |
| H01L 29/161 | (2006.01) |
| H01L 29/16 | (2006.01) |
| H01L 29/201 | (2006.01) |

(52) U.S. Cl.
CPC .. *H01L 21/823821* (2013.01); *H01L 21/02532* (2013.01); *H01L 21/02546* (2013.01); *H01L 21/30604* (2013.01); *H01L 21/823807* (2013.01); *H01L 27/0922* (2013.01); *H01L 29/16* (2013.01); *H01L 29/161* (2013.01); *H01L 29/201* (2013.01)

(58) Field of Classification Search
None
See application file for complete search history.

(56) References Cited

U.S. PATENT DOCUMENTS

| 2013/0069128 A1* | 3/2013 | Okano | 257/288 |
| 2015/0137181 A1* | 5/2015 | Basker et al. | 257/192 |
| 2015/0318351 A1* | 11/2015 | Wu | H01L 29/0657 257/616 |

* cited by examiner

*Primary Examiner* — Marc Armand
*Assistant Examiner* — Younes Boulghassoul
(74) *Attorney, Agent, or Firm* — Wayne F. Reinke, Esq.; Heslin Rothenberg Farley & Mesiti P.C.

(57) ABSTRACT

A non-planar semiconductor structure includes mixed n-and-p type raised semiconductor structures, e.g., fins, having epitaxial structures grown on top surfaces thereof, for example, epitaxial silicon and silicon germanium, naturally growing into a diamond shape. The surface area of the epitaxial structures is increased by removing portion(s) thereof, masking each type as the other type is grown and then subsequently modified by the removal. The removal may create multi-head (e.g., dual-head) epitaxial structures, together with the neck of the respective raised structure resembling a Y-shape.

8 Claims, 11 Drawing Sheets

METHOD FOR INCREASING A SURFACE AREA OF EPITAXIAL STRUCTURES IN A MIXED N/P TYPE FIN SEMICONDUCTOR STRUCTURE BY FORMING MULTIPLE EPITAXIAL HEADS

BACKGROUND OF THE INVENTION

1. Technical Field

The present invention generally relates to non-planar semiconductor structures with epitaxial structures on top surfaces of raised semiconductor structures. More specifically, the present invention relates to such structures with mixed n-and-p-type raised structures, and increasing the surface area of the epitaxial structures without adding additional epitaxial material.

2. Background Information

With the ever-shrinking sizes of semiconductor devices, creativity in design has allowed the decrease in size to continue. For example, non-planar devices with raised semiconductor structures (e.g., "fins") were an important breakthrough, while the inclusion of epitaxial semiconductor structures at the top surface of the raised structures further extended the breakthrough of non-planar devices. Complicating the situation is the inclusion of mixed n-and-p-type raised structures on the same substrate, requiring different epitaxial materials. As dimensions continue their downward march, the real-world sub-structures produced stray farther and farther from the ideal dimensions and/or shape. For example, the raised structures have a tapered shape, getting gradually larger from tip to base, the tip being the location for the epitaxial structure. In turn, the epitaxial structure is smaller, the surface area of which largely determines current throughput, and, hence, a key performance contributor.

Therefore, a need continues to exist for a way to improve semiconductor performance, and, in particular, current throughput, bearing in mind existing design constraints with regard to the total height of the raised structure with epitaxial structure on top.

SUMMARY OF THE INVENTION

The shortcomings of the prior art are overcome and additional advantages are provided through the provision, in one aspect, of a method of fabricating a non-planar semiconductor structure. The method includes providing a semiconductor structure, the structure including a semiconductor substrate, at least one first raised semiconductor structure of a first type coupled to the substrate, and at least one second raised semiconductor structure of a second type coupled to the substrate. The method further includes growing at least one first epitaxial structure on a first top surface of one or more of the at least one first raised structure, the at least one first epitaxial structure including at least one first epitaxial material, and growing at least one second epitaxial structure on a second top surface of one or more of the at least one second raised structure, the at least one second epitaxial structure including at least one second epitaxial material. The method further includes increasing a first surface area of the at least one first epitaxial structure by removing a top portion thereof, the top portion having bottom sides longer than top sides thereof, and increasing a second surface area of the at least one second epitaxial structure by removing a top portion thereof, the top portion having bottom sides longer than top sides thereof.

In accordance with another aspect, a semiconductor structure is provided. The structure includes a semiconductor substrate, at least one first raised semiconductor structure coupled to the substrate, the first raised structure being one of N type and P type, and at least one second raised semiconductor structure coupled to the substrate, the second raised structure being the other of N type and P type. The structure further includes at least one first epitaxial structure of a first epitaxial material coupled to the at least one first raised semiconductor structure, the at least one first epitaxial structure including at least two first epitaxial head structures, and at least one second epitaxial structure of a second epitaxial material coupled to the at least one second raised semiconductor structure, the at least one second epitaxial structure including at least two second epitaxial head structures.

These, and other objects, features and advantages of this invention will become apparent from the following detailed description of the various aspects of the invention taken in conjunction with the accompanying drawings.

DETAILED DESCRIPTION OF THE INVENTION

Figure 1:
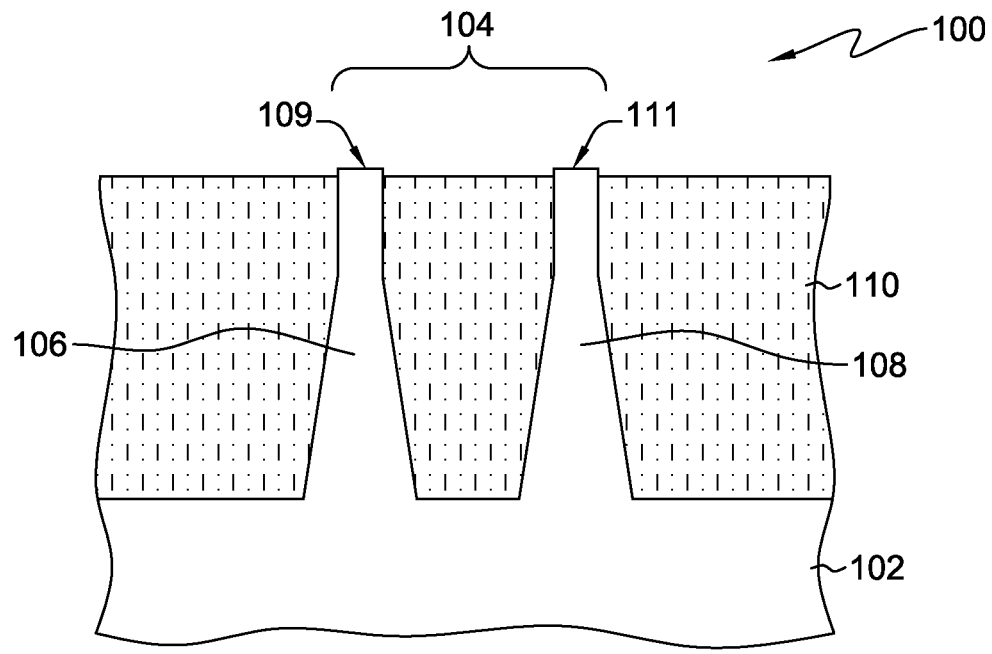
FIG. 1 depicts one example of a starting structure for a non-planar semiconductor structure, including a raised structure of a first type (e.g., P type) and a raised structure of a second type (e.g., N type), in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 depicts one example of a starting structure 100 for a non-planar semiconductor structure, including a semiconductor substrate 102 of any suitable semiconductor material (e.g., a silicon wafer) and raised semiconductor structures 104 coupled to the substrate. Top surfaces 109 and 111 of the structures are exposed, and the structures may include, for example, a raised structure of a first type 106 (e.g., P type) and a raised structure of a second type 108 (e.g., N type). As used herein, the term "raised semiconductor structure" refers to a structure that is raised with respect to the substrate (e.g., a "fin"), creating a non-planar structure. In one example, the raised structures have been etched from the same bulk semiconductor as the substrate. A filler material 110 surrounds the raised semiconductor structures, for example, a dielectric (e.g., an oxide).

In one example, substrate 102 may include any silicon-containing substrate including, but not limited to, silicon (Si), single crystal silicon, polycrystalline Si, amorphous Si, silicon-on-nothing (SON), silicon-on-insulator (SOI), silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

Figure 2:
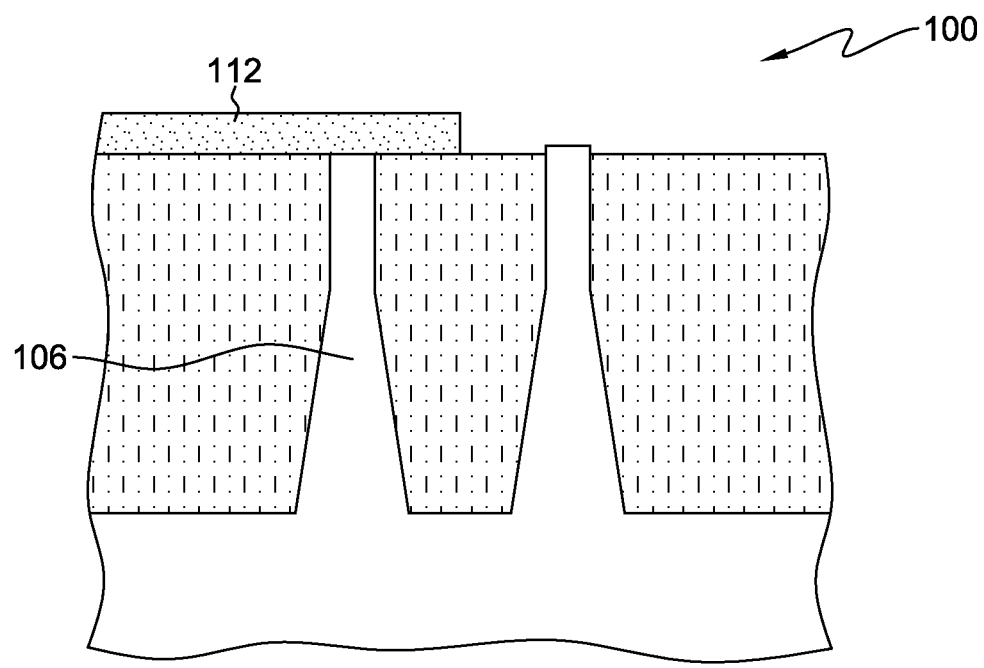
FIG. 2 depicts one example of the structure of FIG. 1 after masking the first raised structure in accordance with one or more aspects of the present invention.

FIG. 2 depicts one example of the structure 100 of FIG. 1 after masking 112 the first raised structure 106 with a protective material. In one example, the hard mask is created by blanket deposition and patterning of the protective material, for example, a nitride (e.g., silicon nitride). Where a nitride is used, the deposition may be accomplished using, for example, CVD, PECVD or ALD, and the patterning may be accomplished by, for example, lithography, and may be followed by dry a etch of the nitride.

Figure 3:
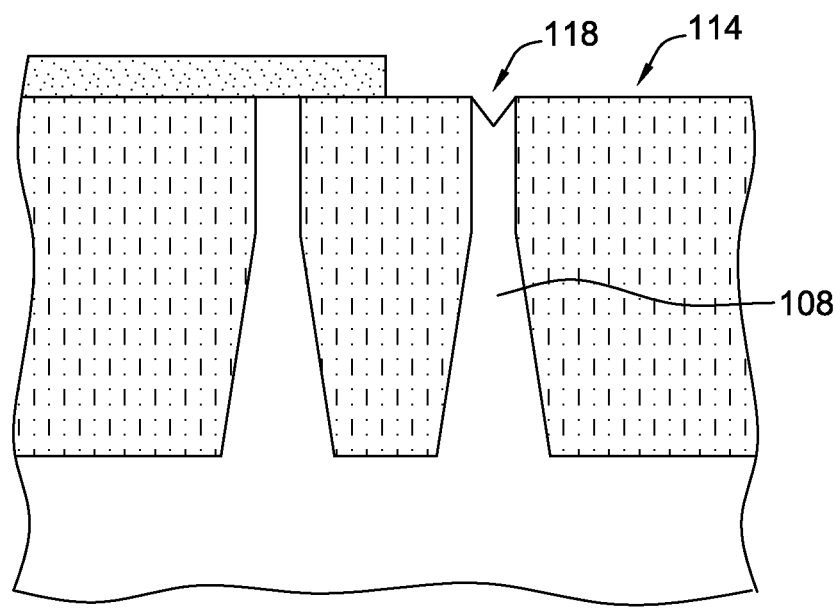
FIG. 3 depicts one example of the structure of FIG. 2 after recessing the second raised structure below a top surface of filler material surrounding the raised structures in accordance with one or more aspects of the present invention.

FIG. 3 depicts one example of the structure 100 of FIG. 2 after recessing the second raised structure 108 below a top surface 114 of the filler material 110 surrounding the raised structures. In one example, where the second raised structure includes n-type silicon, the recess may be performed by, for example, a wet etch, e.g., ammonia or TMAH solution, or a combination of dry etch and wet etch.

Figure 4:
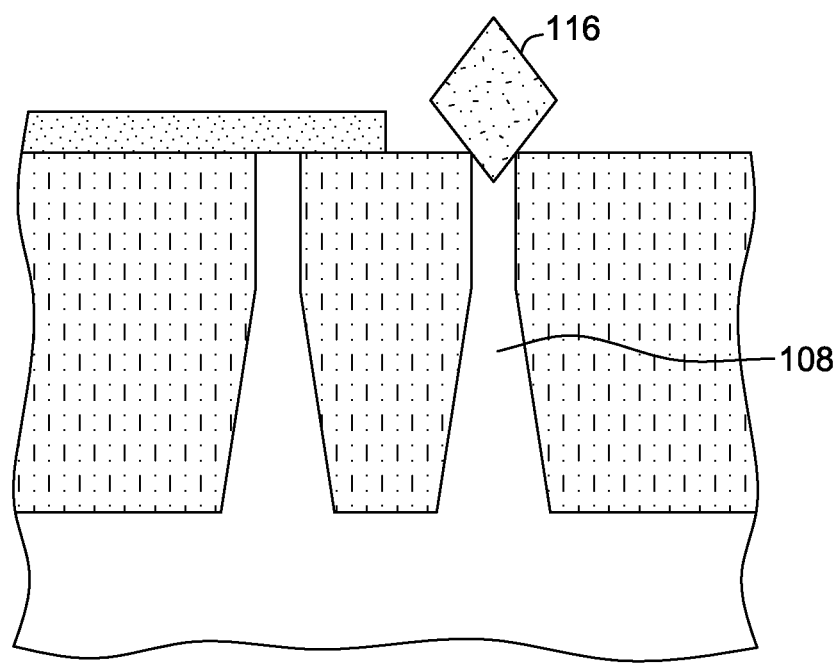
FIG. 4 depicts one example of the structure of FIG. 3 after creating an epitaxial structure of a first type on the recessed top surface of the second raised structure in accordance with one or more aspects of the present invention.

FIG. 4 depicts one example of the structure 100 of FIG. 3 after creating an epitaxial structure 116 of a first type on the recessed top surface (118, FIG. 3) of the second raised structure 108. In one example, the epitaxial material for the first epitaxial structure includes a material that can act as a channel for the second raised structure. For example, where the second raised structure includes n-type silicon, the epitaxial material may include epitaxial silicon. More broadly, the epitaxial structure(s) may include one or more materials from Groups III-V of the Periodic Table of Elements. As one skilled in the art will know, silicon-containing epitaxial material naturally grows into diamond-shaped structures.

Figure 5:
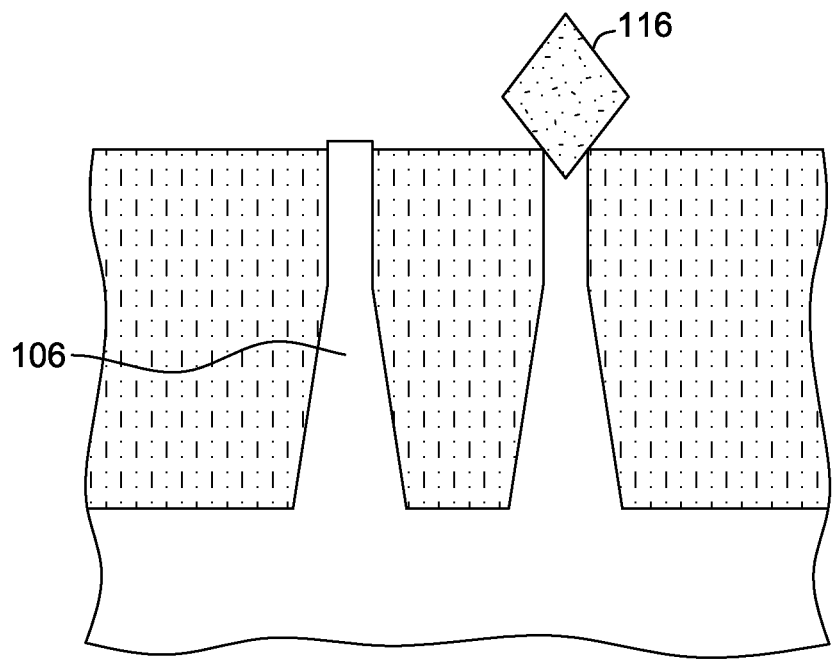
FIG. 5 depicts one example of the structure of FIG. 4 after removal of the mask above the first raised structure in accordance with one or more aspects of the present invention.

FIG. 5 depicts one example of the structure 100 of FIG. 4 after removal of the mask (112, FIG. 1) above the first raised structure 106. In one example, where the mask includes a nitride hard mask, a wet etch, for example, a hot phosphorus solution, may be used for the mask removal.

Figure 6:
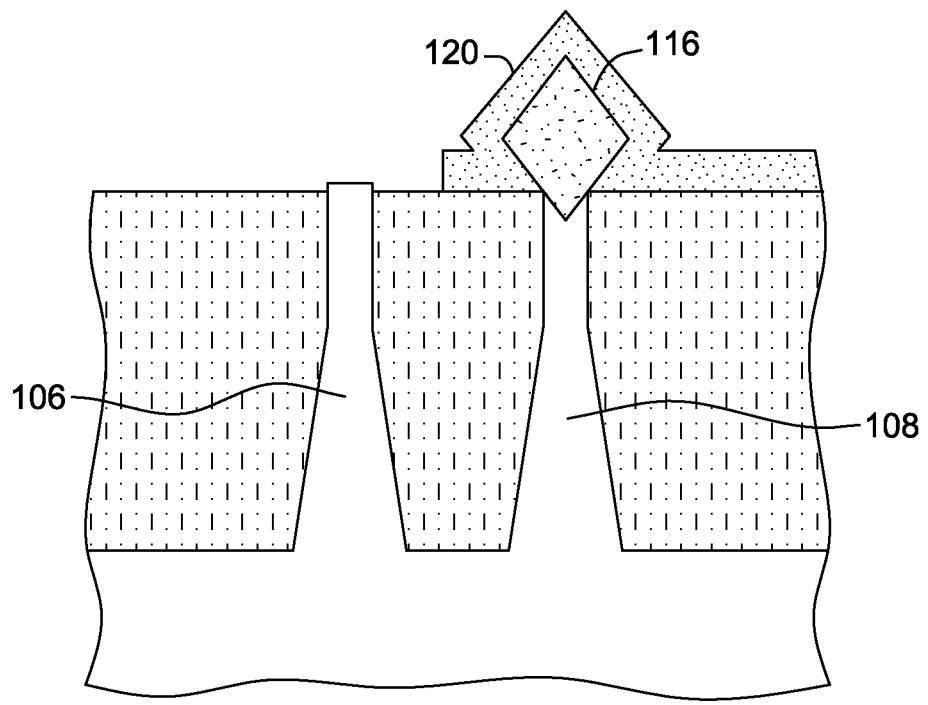
FIG. 6 depicts one example of the structure of FIG. 5 after creating a conformal layer of protective material (i.e., a mask) over the epitaxial structure on the second raised structure and over a top surface of the surrounding filler material in accordance with one or more aspects of the present invention.

FIG. 6 depicts one example of the structure 100 of FIG. 5 after creating a conformal layer 120 of protective material (i.e., a mask) over the first epitaxial structure 116 on the second raised structure 108 and over the top surface (114, FIG. 3) of the surrounding filler material. In one example, where the mask includes a nitride, deposition can be accomplished using, for example, CVD, PECVD or ALD, for a blanket deposition, and the patterning may be done with lithography, followed by a dry etch of the nitride or protective material (i.e., remove the mask above the first raised structure 106).

Figure 7:
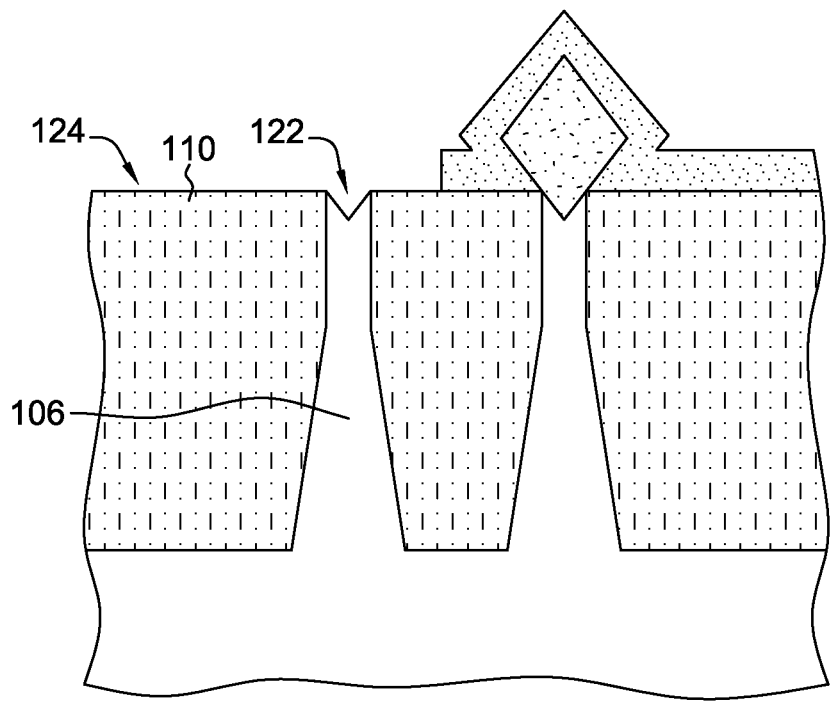
FIG. 7 depicts one example of the structure of FIG. 6 after recessing the first raised structure below a top surface of filler material surrounding the raised structures in accordance with one or more aspects of the present invention.

FIG. 7 depicts one example of the structure 100 of FIG. 6 after recessing 122 the first raised structure 106 below a top surface 124 of filler material 110 surrounding the raised structures. In one example, where the first raised structure includes p-type silicon, the recess may be performed by, for example, a wet etch, e.g., ammonia or TMAH solution, or a combination of dry etch and wet etch.

Figure 8:
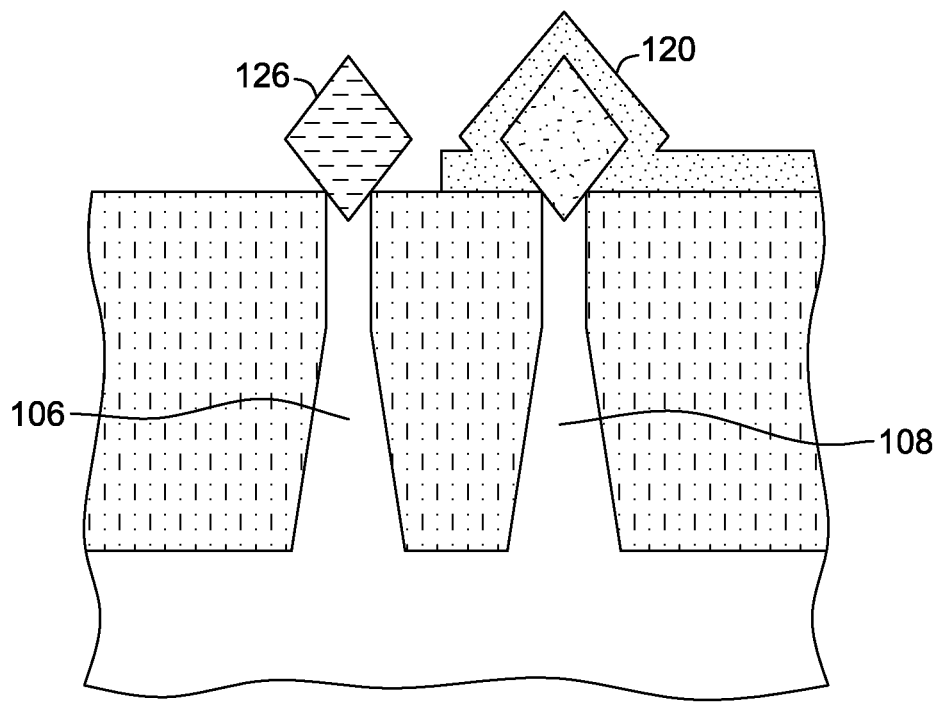
FIG. 8 depicts one example of the structure of FIG. 7 after creating an epitaxial structure of a second type on the recessed top surface of the first raised structure in accordance with one or more aspects of the present invention.

FIG. 8 depicts one example of the structure 100 of FIG. 7 after creating a second epitaxial structure 126 of a second type on the recessed top surface (122, FIG. 7) of the first raised structure 106. In one example, where the first raised structure includes p-type silicon, the epitaxial material of the second epitaxial structure may be, for example, silicon germanium (SiGe), and may be created by, for example, growing the same via, e.g., vapor-phase epitaxy, molecular-beam epitaxy or liquid-phase epitaxy.

Figure 9:
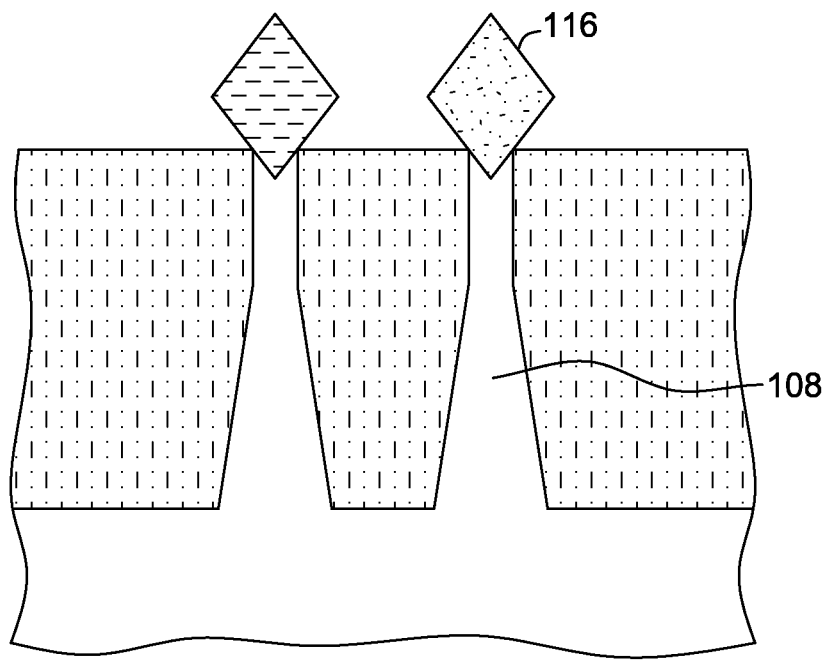
FIG. 9 depicts one example of the structure of FIG. 8 after removal of the mask above the second raised structure in accordance with one or more aspects of the present invention.

FIG. 9 depicts one example of the structure 100 of FIG. 8 after removal of the mask (120, FIG. 8) above the second raised structure 108. In one example, where the second raised structure includes n-type silicon, the first epitaxial structure 116 includes epitaxial silicon, and the mask includes a nitride, removal of the mask may be accomplished using, for example, a wet etch, for example, a hot phosphorus solution.

Figure 10:
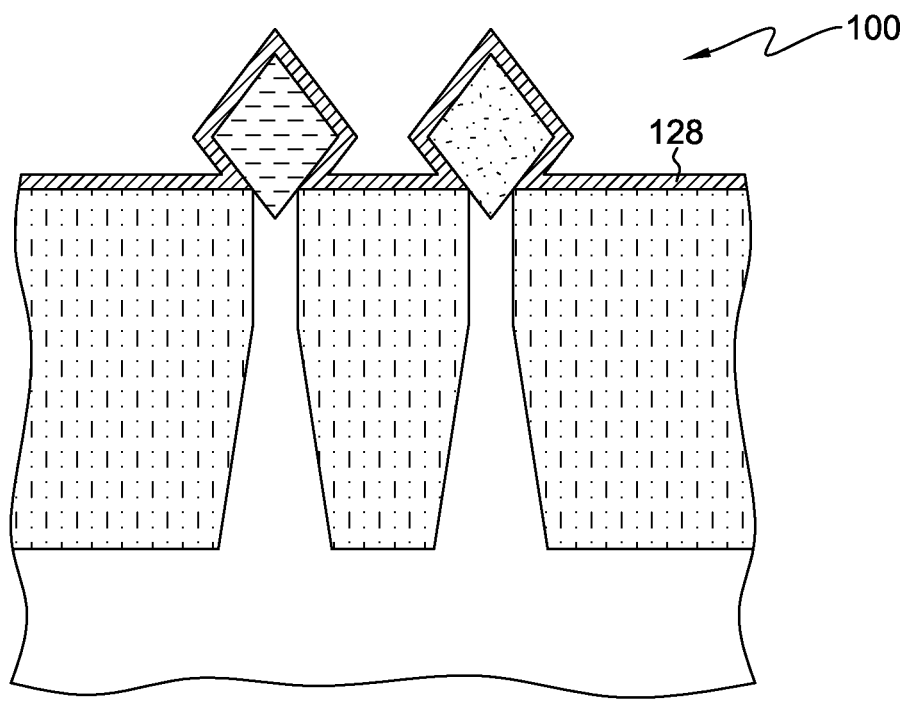
FIG. 10 depicts one example of the structure of FIG. 9 after creating a blanket conformal layer of protective material over the non-planar semiconductor structure in accordance with one or more aspects of the present invention.

FIG. 10 depicts one example of the structure 100 of FIG. 9 after creating a blanket conformal layer 128 of protective material over the non-planar semiconductor structure. In one example, the layer of protective material includes a nitride, and may be deposited using, for example, CVD, PECVD or ALD.

Figure 11:
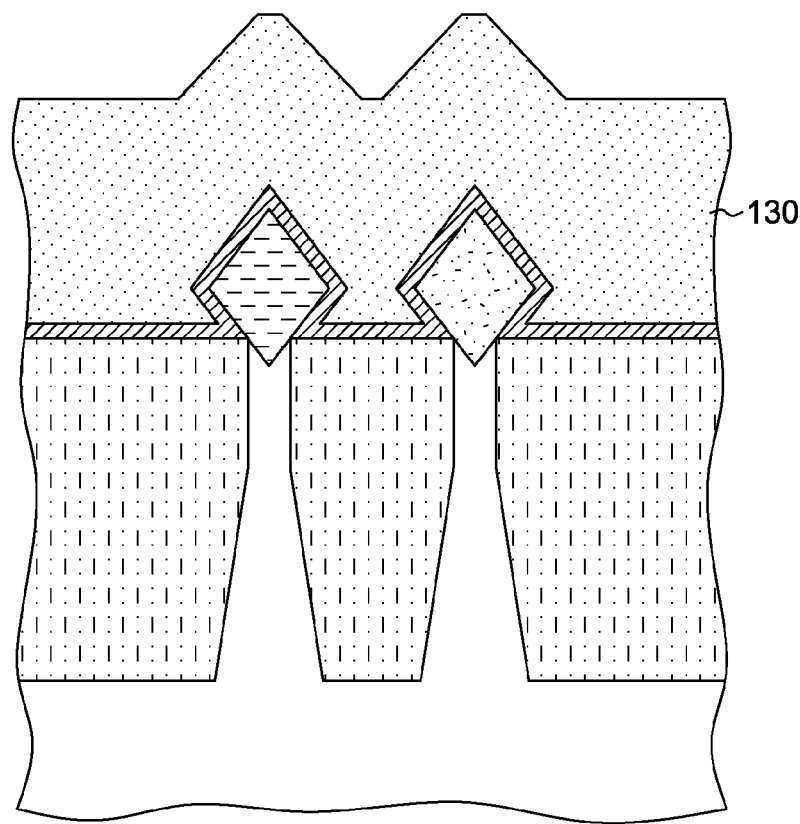
FIG. 11 depicts one example of the structure of FIG. 10 after creating a blanket conformal layer of filler material above the blanket protective layer in accordance with one or more aspects of the present invention.

FIG. 11 depicts one example of the structure 100 of FIG. 10 after creating a blanket conformal layer 130 of filler material above the blanket protective layer. Preferably, the filler material is chosen to be selectively etchable with respect to the layer of protective material, such that the layer of protective material may act as a stop. In one example, the layer of protective material includes a nitride, and the conformal layer of filler material includes, for example, an oxide, and may be deposited by, for example, CVD, PECVD or ALD.

Figure 12:
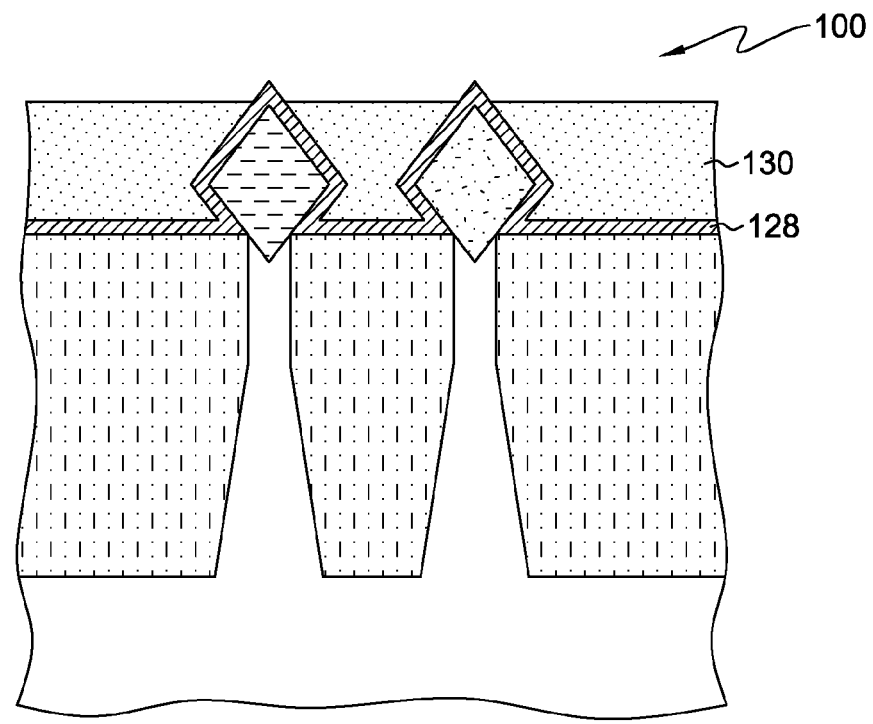
FIG. 12 depicts one example of the structure of FIG. 11 after polishing the blanket filler layer and stopping on the blanket protective layer in accordance with one or more aspects of the present invention.

FIG. 12 depicts one example of the structure 100 of FIG. 11 after etching the blanket conformal filler layer 130 and stopping on the blanket protective layer 128. In one example, where the filler material is an oxide and the layer of protective material includes a nitride, the etch may be performed using, for example, chemical mechanical polishing.

Figure 13:
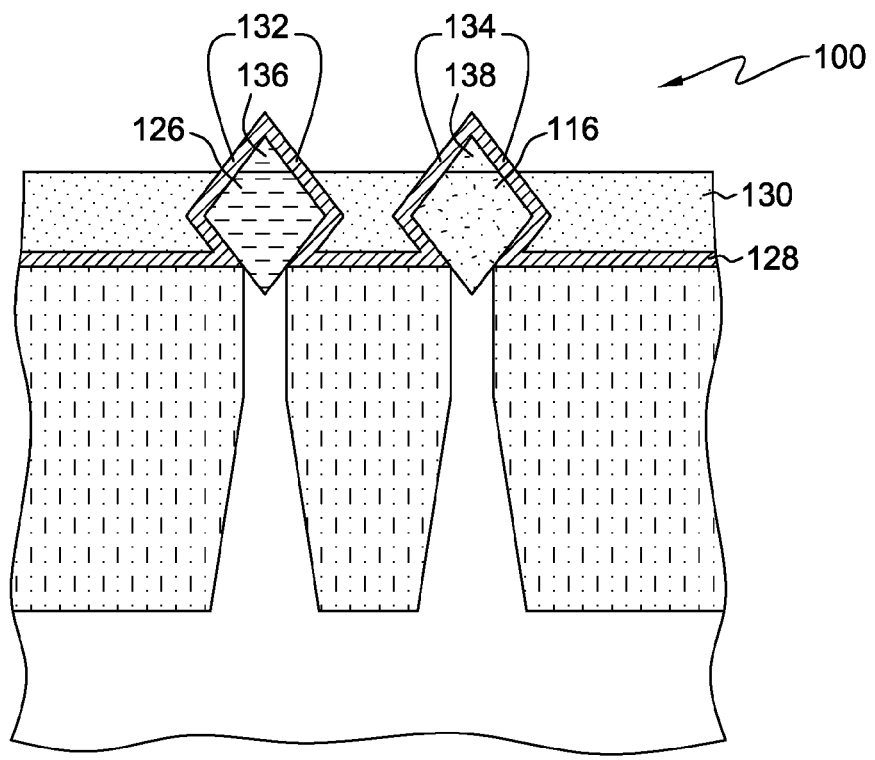
FIG. 13 depicts one example of the structure of FIG. 12 after further etching the blanket filler layer to expose a portion of the blanket protective layer above portions of the epitaxial structures subsequently to be removed in accordance with one or more aspects of the present invention.

FIG. 13 depicts one example of the structure 100 of FIG. 12 after further etching the blanket filler layer 130 to expose portions (132, 134) of the blanket protective layer 128 above portions (136, 138, respectively) of the epitaxial structures (126, 116) subsequently to be removed. In one example, where the filler material is an oxide and the layer of protective material includes a nitride, the filler etch may be performed using, for example, a dry etch, e.g., a plasma etch, a wet etch (e.g., HF or dHF solutions), or a combination of dry etch and wet etch.

Figure 14:
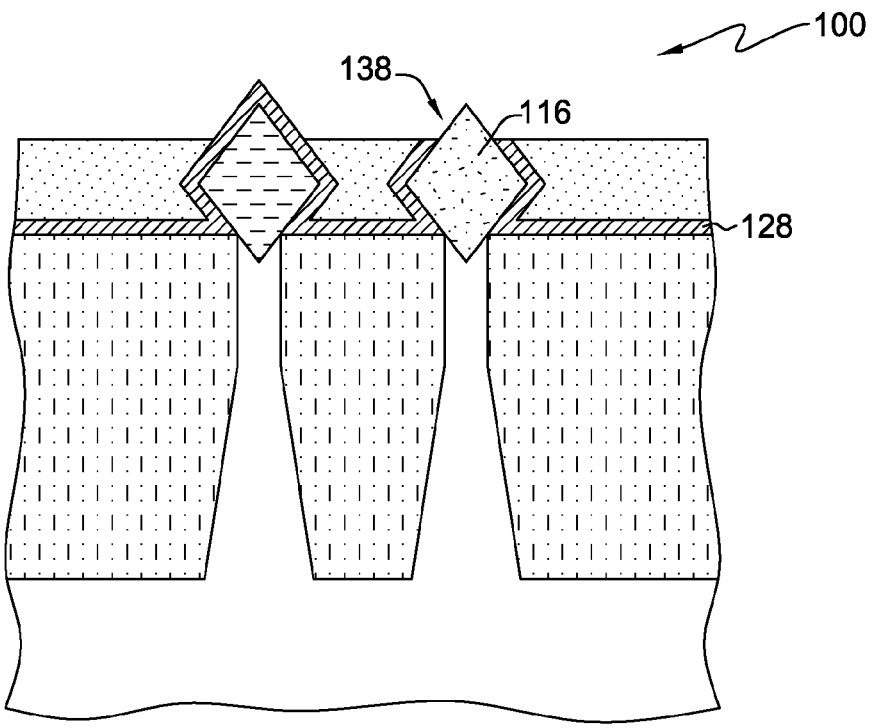
FIG. 14 depicts one example of the structure of FIG. 13 after patterning the blanket protective layer to expose the portion of the second raised structure sought to be removed in accordance with one or more aspects of the present invention.

FIG. 14 depicts one example of the structure 100 of FIG. 13 after patterning the blanket protective layer 128 to expose the portion 138 of the first epitaxial structure 116 sought to be removed. In one example, where the filler material includes an oxide, the layer of protective material includes a nitride, and the epitaxial material of the first epitaxial structure includes epitaxial silicon, the protective layer patterning may be performed using, for example, lithography, and may be followed by a dry etch of the nitride portion 138.

Figure 15:
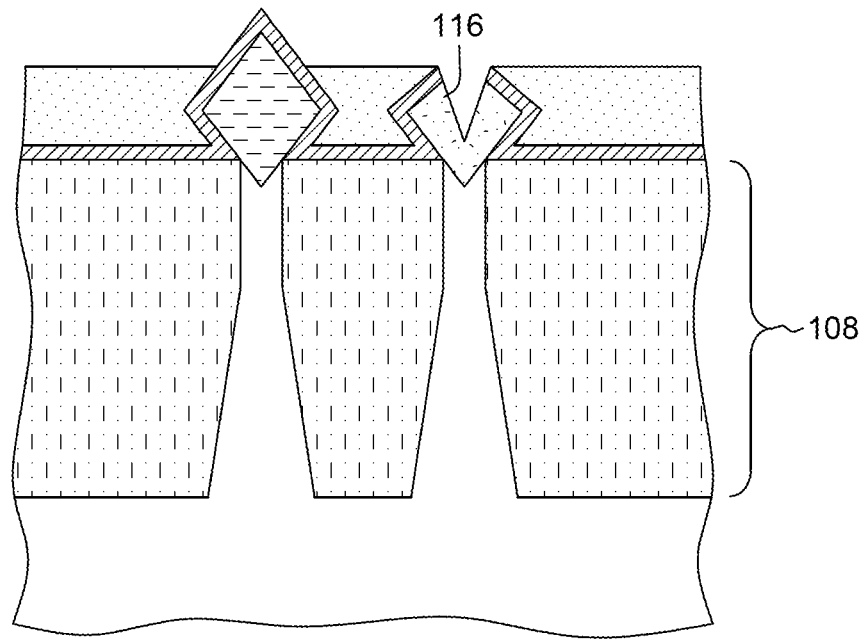
FIG. 15 depicts one example of the structure of FIG. 14 after removal of the exposed portion of the first epitaxial structure above the second raised structure in accordance with one or more aspects of the present invention.

FIG. 15 depicts one example of the structure 100 of FIG. 14 after removal of the exposed portion (138, FIG. 14) of the first epitaxial structure 116 above the second raised structure 108. In one example, where the filler material is an oxide, the layer of protective material includes a nitride and the epitaxial material of the first epitaxial structure includes epitaxial silicon, the first epitaxial structure etch may be performed using, for example, a wet etch, e.g., ammonia or TMAH solution, or a hybrid method with a combination of dry etch and wet etch. Note that the epitaxial silicon is crystal and the etch follows the crystal orientation.

Figure 16:
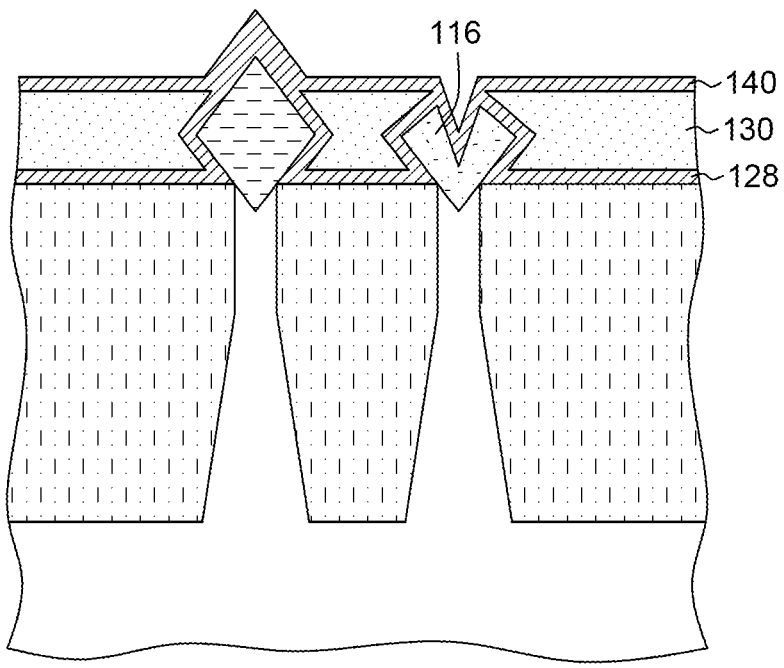
FIG. 16 depicts one example of the structure of FIG. 15 after creating a second blanket conformal layer of protective material over the non-planar semiconductor structure in accordance with one or more aspects of the present invention.

FIG. 16 depicts one example of the structure 100 of FIG. 15 after creating a second blanket conformal layer 140 of protective material over the non-planar semiconductor structure. In one example, where the filler material 130 is an oxide, the first layer of protective material 128 includes a nitride and the epitaxial material of the first epitaxial structure 116 includes epitaxial silicon, the second conformal layer of protective material may be, for example, a nitride and deposition thereof may be performed using, for example, CVD, PECVD or ALD.

Figure 17:
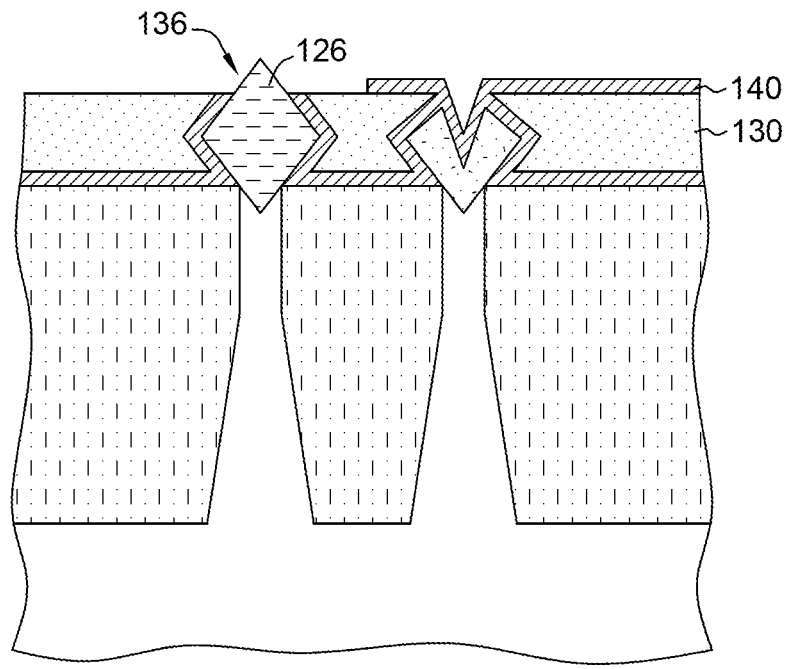
FIG. 17 depicts one example of the structure of FIG. 16 after patterning the second blanket conformal protective layer to remove the protective material over the first raised structure and the surrounding filler material to expose a portion of the second epitaxial structure sought to be removed in accordance with one or more aspects of the present invention.

FIG. 17 depicts one example of the structure 100 of FIG. 16 after patterning the second blanket conformal protective layer 140 to remove the protective material over the portion 136 of the second epitaxial structure 126 sought to be removed and the surrounding filler material 130. In one example, where the second protective layer 140 includes a nitride, deposition thereof can be accomplished using, for example, CVD, PECVD or ALD, and the patterning thereof may be done with lithography, followed by a dry etch of the nitride or protective material.

Figure 18:
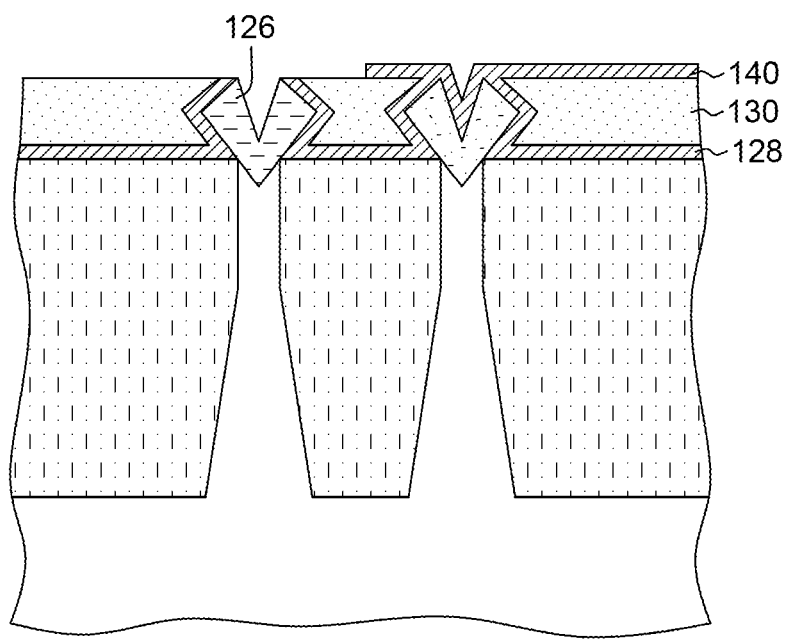
FIG. 18 depicts one example of the structure of FIG. 17 after removing the portion of the second epitaxial structure in accordance with one or more aspects of the present invention.

FIG. 18 depicts one example of the structure 100 of FIG. 17 after removing the portion (136, FIG. 17) of the second epitaxial structure 126. In one example, where the layer 130 of filler material is an oxide, both layers (140, 128) of protective material include a nitride and the epitaxial material of the second epitaxial structure 126 includes epitaxial silicon germanium, the second epitaxial structure etch may be performed using, for example, a wet etch, e.g., ammonia or TMAH solution, or a hybrid method with combination of dry etch and wet etch. Note that the epitaxial silicon germanium is crystal and the etch follows the crystal orientation.

Figure 19:
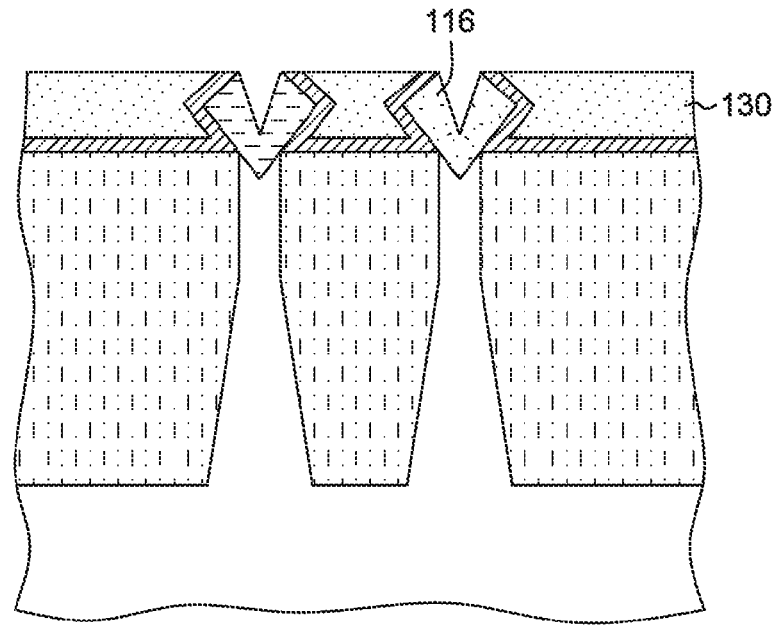
FIG. 19 depicts one example of the structure of FIG. 18 after removing the second blanket conformal protective layer above the second raised structure and the surrounding filler material in accordance with one or more aspects of the present invention.

FIG. 19 depicts one example of the structure 100 of FIG. 18 after removing the second blanket conformal protective layer (140, FIG. 18) above the first epitaxial structure 116 and the surrounding filler material 130. In one example, where the filler material is an oxide, both layers of protective material include a nitride, the epitaxial material of the first epitaxial structure includes epitaxial silicon and the epitaxial material of the second epitaxial structure includes epitaxial silicon germanium, removal of the remaining second protective layer may be accomplished using, for example, a wet etch, e.g., a hot phosphorus solution.

Figure 20:
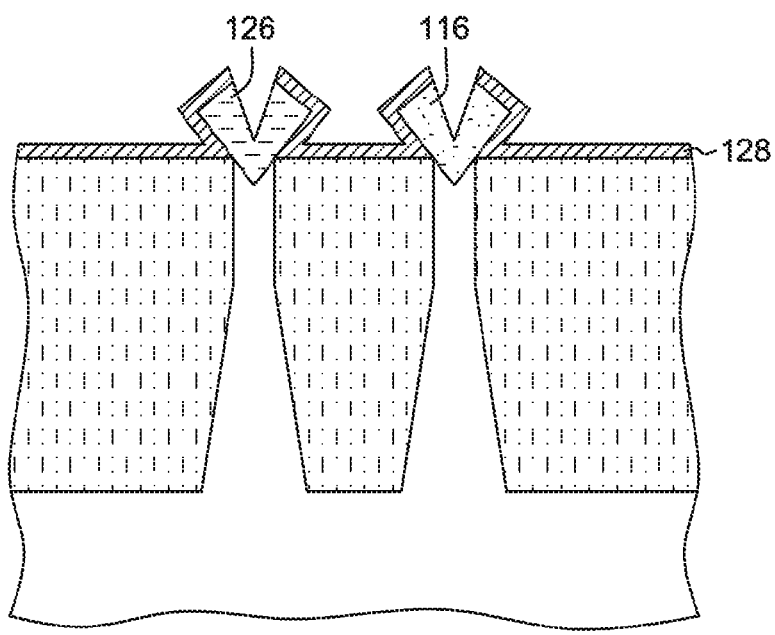
FIG. 20 depicts one example of the structure of FIG. 19 after removal of the filler material above the first blanket conformal protective layer in accordance with one or more aspects of the present invention.

FIG. 20 depicts one example of the structure 100 of FIG. 19 after removal of the filler material (130, FIG. 19) above the first blanket conformal protective layer 128. In one example, where the filler material is an oxide, the first layer of protective material includes a nitride, the epitaxial material of the first epitaxial structure 116 includes epitaxial silicon and the epitaxial material of the second epitaxial structure 126 includes epitaxial silicon germanium, removal of the filler material may be accomplished using, for example, a wet etch, or a combination of dry etch and wet etch.

Figure 21:
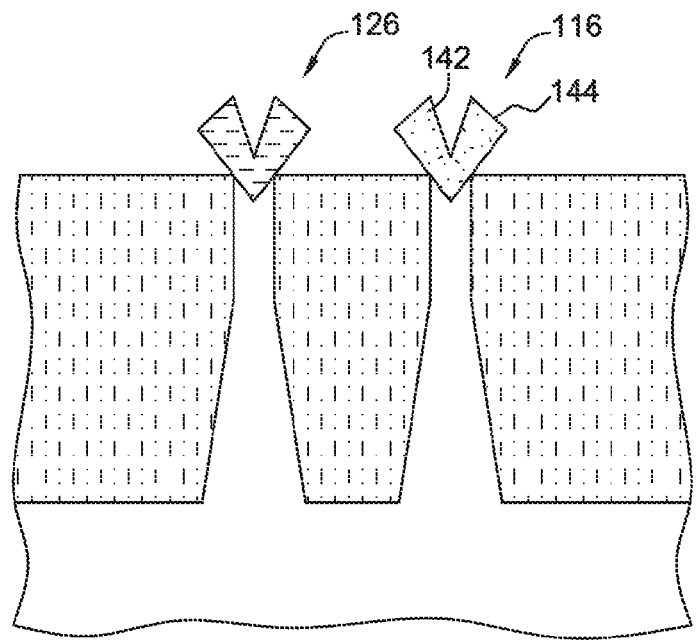
FIG. 21 depicts one example of the structure of FIG. 20 after removal of the first blanket conformal protective layer, exposing the two-headed epitaxial structures created by the removal of the portions of the epitaxial structures, in accordance with one or more aspects of the present invention.

FIG. 21 depicts one example of the structure 100 of FIG. 20 after removal of the first blanket conformal protective layer (128, FIG. 20), revealing the multi-headed (two heads in this example) epitaxial structures (126, 116) created by the removal of the portions of the epitaxial structures (e.g., heads 142 and 144 of epitaxial structure 116). In one example, where the filler material is an oxide, the first layer of protective material includes a nitride, the epitaxial material of the first epitaxial structure includes epitaxial silicon and the epitaxial material of the second epitaxial structure 126 includes epitaxial silicon germanium, removal of the remaining first protective layer may be accomplished using, for example, a wet etch, e.g., a hot phosphorus solution.

Figure 22:
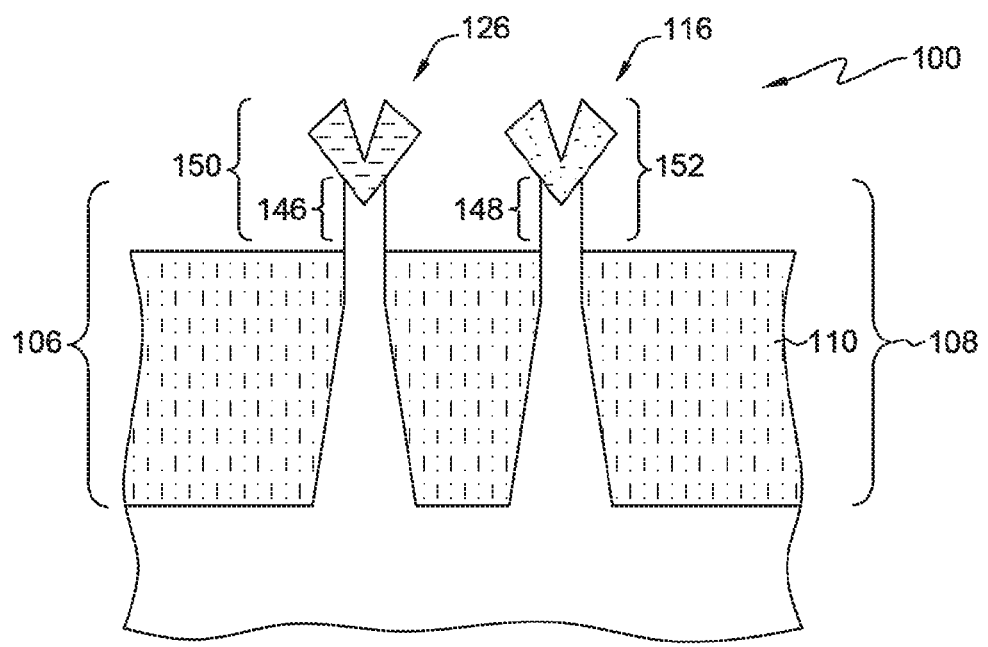
FIG. 22 depicts one example of the structure of FIG. 21 after recessing the filler material to expose neck portions of the raised semiconductor structures in accordance with one or more aspects of the present invention.

FIG. 22 depicts one example of the structure 100 of FIG. 21 after recessing the layer 110 of filler material to expose neck portions (146, 148) of the raised semiconductor structures (106, 108, respectively). In one example, where the filler material surrounding the raised structures is an oxide, the material of the first raised structure is p-type silicon, the material of the second raised structure is n-type silicon, the epitaxial material of the first epitaxial structure 116 includes epitaxial silicon and the epitaxial material of the second epitaxial structure 126 includes epitaxial silicon germanium, etching of the filler material to expose the necks may be accomplished using, for example, a dry etch, wet etch, COR (chemical oxide removal) etch or a combination thereof. Further, in the present example, the epitaxial structures together with their respective necks each resemble a Y-shape (150, 152).

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
providing a semiconductor structure, the structure comprising a semiconductor substrate, at least one first raised semiconductor structure of a first type coupled to the substrate, and at least one second raised semiconductor structure of a second type coupled to the substrate;
growing at least one first epitaxial structure on a first top surface of one or more of the at least one first raised structure, wherein the at least one first epitaxial structure comprises at least one first epitaxial material;
growing at least one second epitaxial structure on a second top surface of one or more of the at least one second raised structure, wherein the at least one second epitaxial structure comprises at least one second epitaxial material;
increasing a first surface area of the at least one first epitaxial structure by removing a top portion thereof, the top portion having bottom sides longer than top sides thereof;
increasing a second surface area of the at least one second epitaxial structure by removing a top portion thereof, the top portion having bottom sides longer than top sides thereof;
wherein the semiconductor structure further comprises a filler layer of at least one filler material conformally surrounding the at least one first raised structure and the at least one second raised structure while exposing the first top surface and the second top surface, and wherein:
growing the at least one first epitaxial structure comprises: masking the at least one second raised structure; recessing the exposed first top surface below a top surface of the filler layer; and growing the at least one first epitaxial structure on the recessed first top surface; and
growing the at least one second epitaxial structure comprises: masking the at least one first epitaxial structure; recessing the exposed second top surface below a top surface of the filler layer; and growing the at least one second epitaxial structure on the recessed second top surface.

2. The method of claim 1, wherein the removing creates a depression with an epitaxial head structure on opposite sides of the depression.

3. The method of claim 1, wherein the increasing comprises:
creating a conformal first layer of a first material over the filler layer, the at least one first epitaxial structure and the at least one second epitaxial structure;
conformally covering the first layer with a second layer of a second material having etch characteristics selective to the first layer; and etching the second layer to expose the first layer over one or more portions of each of the at least one first epitaxial structure and the at least one second epitaxial structure.

4. The method of claim 3, wherein etching the second layer comprises:

etching the second layer using the first layer as an etch stop; and further etching the second layer to perform the exposing.

5. The method of claim 4, further comprising:

removing the first layer over the one or more portions of the at least one first epitaxial structure; and etching the one or more portions from the at least one first epitaxial structure.

6. The method of claim 5, further comprising, after etching the one or more portions from the at least one first epitaxial structure:

conformally covering exposed portions of the at least one first epitaxial structure with a layer of the first material;

removing the first layer over the one or more portions of the at least one second epitaxial structure; and etching the one or more portions from the at least one second epitaxial structure.

7. The method of claim 6, further comprising, after etching the one or more portions from the at least one second epitaxial structure, removing remaining first material covering the semiconductor structure.

8. The method of claim 7, further comprising, after removing the remaining first material covering the semiconductor structure:

removing the second layer of the second material to expose the first layer of the first material; and removing the first layer of the first material to expose the at least one first and the at least one second epitaxial structure.

* * * * *